United States Patent [19]

Kihara et al.

[11] Patent Number: 4,943,736
[45] Date of Patent: Jul. 24, 1990

[54] WAVEFORM CONVERTING APPARATUS

[75] Inventors: Seiichiro Kihara, Nara; Naonori Okabayashi, Sakurai, both of Japan

[73] Assignee: Sharp Kabushiki Kaisha, Osaka, Japan

[21] Appl. No.: 301,581

[22] Filed: Jan. 26, 1989

[30] Foreign Application Priority Data

Jan. 26, 1988 [JP] Japan .................. 63-15450

[51] Int. Cl.$^5$ .................. H03K 5/00; G06G 7/10; G05F 3/16
[52] U.S. Cl. .................. 307/261; 307/491; 307/494; 307/455; 307/520; 328/165; 328/167; 323/316
[58] Field of Search .................. 307/261, 491, 494, 520, 307/455, 521; 328/127, 167, 165; 323/316, 267

[56] References Cited

U.S. PATENT DOCUMENTS

| | | | |
|---|---|---|---|
| 4,283,673 | 8/1981 | Lieux | 323/316 |
| 4,302,719 | 11/1981 | Mattfeld | 323/316 |
| 4,651,038 | 3/1987 | Cline et al. | 307/491 |
| 4,734,598 | 3/1988 | Bohme | 307/494 |
| 4,740,766 | 4/1988 | Metz | 323/316 |

Primary Examiner—Stanley D. Miller
Assistant Examiner—Trong Quang Phan

[57] ABSTRACT

A waveform converting apparatus includes a first and a second common-emitter type transistors as part of a first and second emitter follower circuits respectively. The follower circuits are used for converting the impedances of an input signal independently. A first constant current supply is connected to the emitter of the first transistor provided in the first emitter follower circuit, and a second constant current supply is connected to the emitter of the second transistor provided in the second emitter follower circuit. The constant current flowing in the first emitter follower circuit is adjusted to be of a smaller value than the constant current flowing in the second emitter follower circuit. With this difference in current value there is a difference between the base-emitter voltage of the first transistor in the first emitter follower circuit and the base-emitter voltage of the second transistor in the second emitter follower circuit on the basis of the ratio of the first and second constant currents mentioned above. Also with the above described difference in currents a ceramic chip capacitor can be used in an integrating circuit of the converting apparatus.

8 Claims, 3 Drawing Sheets

WAVEFORM CONVERTING APPARATUS

BACKGROUND OF THE INVENTION

1. Field of the Invention

The present invention relates to a waveform converting device for removing a carrier signal for example in an infrared remote control light receiving unit.

2. Description of the Prior Art

A conventional prior art, waveform converting device is described with reference to FIGS. 1 and 2.

In FIG. 1, there is shown a conventional waveform converting circuit for removing a carrier signal in an infrared remote control light receiving circuit from a pulse position modulation (referred to as PPM hereinafter) signal of which amplitude is modulated at the rate of 100 percent.

In the case that a data signal "1000", as shown in FIG. 2, is transmitted, an amplitude modulation (referred to as AM hereinafter) of a PPM signal representing the data "1000" is performed at the rate of 100% by a carrier signal with a frequency of 38 kHz and the modulated PPM signal is generated from an infrared remote control device (not shown). In a light receiving unit, the modulated PPM signal generated from the infrared remote control device is received as is entered as an input signal voltage $V_{in}$. The input signal voltage $V_{in}$ is applied into first and second emitter follower circuits 11 and 12 respectively. The first emitter follower circuit 11 is composed of a common-emitter type transistor $Q_{21}$ the emitter of which is connected to a first constant current unit 13 for supplying a constant current $I_{11}$, so that the impedance conversion of the input signal voltage $V_{in}$ is performed. The second emitter follower circuit 12 comprises a common-emitter type transistor $Q_{22}$ the emitter of which is connected to a second constant current unit 14 through a resistor $R_{11}$ so as to supply a constant current $I_{12}$, so that the impedance conversion of the input signal voltage $V_{in}$ is performed. Accordingly, in the second emitter follower circuit 12, the wave level of the input signal voltage $V_{in}$ is shifted down in correspondence with a voltage drop in the resistor $R_{11}$. The voltage drop in the resistor $R_{11}$ can be considered constant because of the constant current $I_{12}$, if the current flowing toward the output side is ignored.

The output signal of the first emitter follower circuit 11 is transmitted to a minus input terminal of a comparator 16 through a first integrating circuit 15 which is composed of a resistor $R_{12}$ and a capacitor $C_{11}$. The circuit 15 integrates the input signal voltage $V_{in}$. As the time constant of the first integrating circuit 15 is long enough, the first integrating circuit 15 outputs a signal at a generally constant level representing the input level. The output signal of the second emitter follower circuit 12 is transmitted to a plus input terminal of comparator 16 through a resistor $R_{13}$. The comparator 16 compares the minus input signal A transmitted from the first emitter follower circuit 11 with the plus input signal B transmitted from the second emitter follower circuit 12 as shown in FIG. 2, and when the level of the input signal B which is the level shifted input voltage $V_{in}$ exceeds the level of the input signal A, the comparator 16 outputs a high level of two-value signal. The output signal of the comparator 16 is transmitted through a second integrating circuit 17 so as to generate an output signal voltage $V_{out}$ of the waveform converting device. The second integrating circuit 17 comprises a capacitor $C_{12}$ and integrates the output signal of the comparator 16. Accordingly, as shown in FIG. 2, the output signal voltage $V_{out}$ of the waveform converting device is recovered to the original PPM signal and the carrier signal can be removed.

In such a conventional waveform converting device, as described above as the time constant of the first integrating circuit 15 must be made long, it is necessary to provide a capacitor $C_{11}$ of large capacitance, for example, with a value of 10 $\mu$ F. In order to obtain such a large capacitance, it is necessary to use an electrolytic capacitor. For this reason, there have been problems that, in case of fabricating the waveform converting circuit in an integrated circuit form, it is difficult to miniaturize a light receiving unit because the electrolytic capacitor must be externally attached to the device, and that the cost of the light receiving unit can not be reduced because of the high cost of the electrolytic capacitor and the problems of the connecting the capacitor.

In addition, even though the capacitance of the capacitor $C_{11}$ is made small, if the resistance of the resistor $R_{12}$ is made large in the first integrating circuit 15, the same time constant can be obtained. However, if the resistance of the resistor $R_{11}$ is made large and the capacitance of the capacitor $C_{11}$ is made small, the impedance of the first integrating circuit 15 is increased. Therefore, if the constant current $I_{11}$ obtained by the first constant current unit 13 is reduced, also the constant current $I_{12}$ obtained by the second constant current unit 14 must be reduced according to the reduction of the constant current $I_{11}$. Therefore, the resistance of the resistor $R_{11}$ must be made large in order to obtain a predetermined level of voltage shifted down in the second emitter follower circuit 12. Therefore, there has been also a problem that, in the case of fabricating the waveform converting circuit in the integrated circuit form, since a large area on a chip is occupied by the resistor $R_{11}$ in order to obtain a large resistance of the resistor $R_{11}$, the integration of the waveform converting circuit is made difficult.

SUMMARY OF THE INVENTION

The present invention has been made in order to solve the problems mentioned above and an essential object of the present invention is to provide a waveform converting device that includes;

- a first and a second transistor for forming first and second emitter follower circuits, respectively, for converting the impedance of an input signal independently;
- a first constant current supply means which is connected to the emitter of the first transistor provided in the first emitter follower circuit; and
- a second constant current supply means is connected to the emitter of the second transistor provided in the second emitter follower circuit.
- A first integrating circuit arrangement for integrating an output voltage of said first emitter follower circuit is provided.
- A comparator is used for comparing the output voltage of the first integrating circuit arrangement with the output voltage of the second emitter follower circuit, and a second integrating circuit arrangement is used for integrating the output voltage of the comparator, wherein the current flowing in the first emitter follower circuit through said first constant current supply means is adjusted to be smaller than the current flowing in the second emitter follower circuit through said second constant current supply means.

According to the structure of the device mentioned above, when the constant current flowing in the first emitter follower circuit becomes smaller than the constant current flowing in the second emitter follower circuit (that is the smaller current is of one value and the current in the second emitter circuit has a greater value), there occurs a difference between the base-emitter voltage of the first transistor provided in the first emitter follower circuit and the base-emitter voltage of the second transistor provided in the second emitter follower circuit on the basis of the ratio of the first and second constant currents mentioned above. Therefore, if the ratio of the first and second constant currents is properly adjusted, the level shifted voltage can be obtained from the difference between the first and second base-emitter voltages. Accordingly, in the second emitter follower circuit 12 it becomes unnecessary to provide a resistor $R_{11}$ used in the conventional waveform converting device.

Moreover, in the case that the ratio of the first and second constant currents is adjusted as described above, the first constant current obtained through the first constant current means can be made smaller than the second constant current obtained through the second constant current means even when the second constant current is made equal to the constant current $I_{12}$ obtained through the second constant current unit 14 in the conventional device. Therefore, since the impedance of the first integrating circuit can be increased, the capacitance of the capacitor in the first integrating circuit can be made small maintaining the same value of the time constant. Accordingly, the capacitor in the first integrating circuit can be for example, a ceramic chip capacitor which is comparatively small and inexpensive.

DETAILED DESCRIPTION OF THE PREFERRED EMBODIMENT

An embodiment of the present invention will be described hereinafter with reference to FIGS. 3 and 4.

A waveform converting device according to the present invention is made in the form of an integrated circuit.

Figure 3:
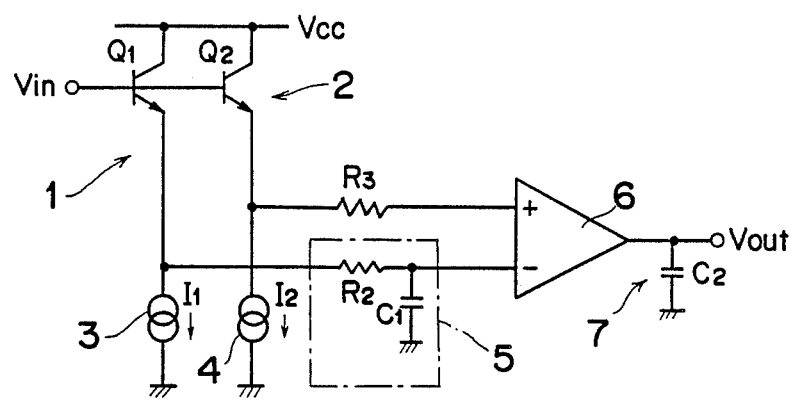
FIG. 3 is a circuit diagram showing an embodiment of a waveform converting device according to the present invention.
Figure 4:
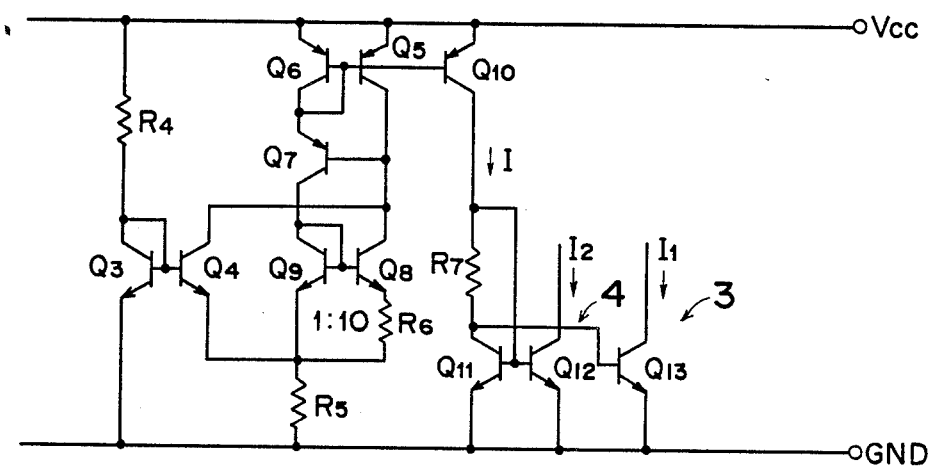
FIG. 4 is a circuit diagram showing a constant current circuit according to the present invention.

As shown in FIG. 3, in the waveform converting device, an input signal voltage $V_{in}$ is applied to the base of each npn transistors $Q_1$ and $Q_2$ respectively provided in a first and second emitter follower circuits 1 and 2. The collector of each of the npn transistors $Q_1$ and $Q_2$ is connected to a power source $V_{cc}$ and the emitter of each of the transistors $Q_1$ and $Q_2$ are connected to first and second constant current units 3 and 4, thereby constituting the emitter follower circuits 1 and 2. The first and second constant current units 3 and 4 are provided in order to supply constant currents $I_1$ and $I_2$ respectively. The quantity of the constant current $I_1$ fed by the first constant current unit 3 is made smaller than the constant current $I_2$ fed by the second constant current unit 4.

An embodiment of the first and second constant current units 3 and 4 is briefly explained with reference to FIG. 4.

Current mirror circuits having transistors $Q_3$ and $Q_4$ are so arranged as to activate the constant current units 3 and 4. That is, when the power supply voltage $V_{cc}$ is applied to the circuit, a current flows from the power source to the transistor $Q_3$ through a resistor $R_4$, so that the same current flows into the transistor $Q_4$ through the current mirror circuit thereof. However, once a current flows through the transistor $Q_4$, there occurs a voltage drop across a resistor $R_5$ connected to the emitter of the transistor $Q_4$ so that the current flowing through the transistor $Q_4$ is stopped, whereby the constant current units 3 and 4 are activated.

Each of the current mirror circuits of the transistors $Q_5$ to $Q_9$ constitutes the main body of the constant current units 3 and 4. When there occurs a current flow caused by the above mentioned activating circuit of the constant current units 3 and 4, a current of the same quantity flows through the transistors $Q_8$ and $Q_9$ respectively by the current mirror circuits of the transistors $Q_5$ to $Q_7$. However, since the area of the emitter of the transistor $Q_8$ is made ten times the area of the emitter of the transistor $Q_9$, the voltage between the base and the emitter (referred to as base-emitter voltage hereinafter) of the transistor $Q_8$ becomes smaller than that of the transistor $Q_9$. Herein, the value of the current flowing through the transistors $Q_8$ and $Q_9$ is the quotient of a division in which the difference between the base-emitter voltage of the transistor $Q_8$ and the base-emitter voltage of the transistor $Q_9$ is divided by the resistance of the resistor $R_6$. Therefore, the current flowing through the transistors $Q_8$ and $Q_9$ is independent of the power source voltage $V_{cc}$ and is defined by the resistance of the resistor $R_6$.

Therefore, if the constant current I with the same quantity flows through a transistor $Q_{10}$, a constant current $I_2$ flows having the same quantity as that of the current I through a transistor $Q_{12}$ by a current mirror circuit of the transistor $Q_{11}$. The circuit arrangement supplying the constant current $I_2$ is operated as the second constant current unit 4. Also, a constant current $I_1$ flows through a transistor $Q_{13}$, which is smaller than the constant current $I_2$, and the ratio $I_1/I_2$ is a constant value which is defined by a voltage drop across a resistor $R_7$. The circuit arrangement supplying the constant current $I_1$ is operated as the first constant current unit 3.

Figure 1:
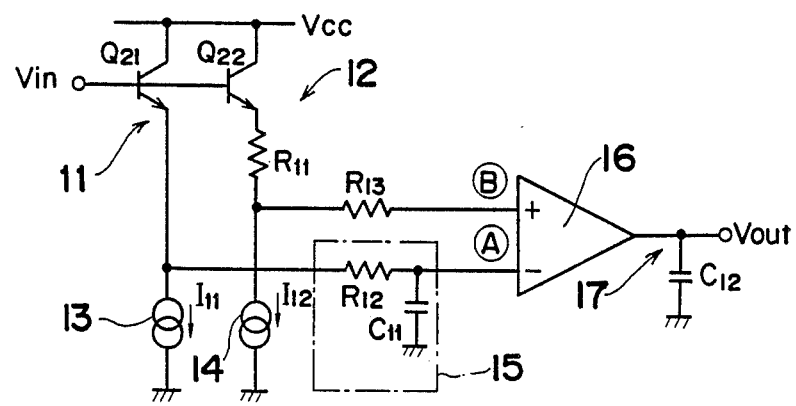
FIG. 1 is a circuit diagram showing a conventional waveform converting device.

As shown in FIG. 3, the output terminal of a first emitter follower 1 is connected to the minus input terminal of a comparator 6 through a first integrating circuit 5. The first integrating circuit 5 includes a resistor $R_2$ and a capacitor $C_1$ and integrates the waveform of the output signal of the first emitter follower circuit 1. There has been used an electrolytic capacitor of generally 10 $\mu$F as the capacitor $C_{11}$ in the conventional first integrating circuit 15 as shown in FIG. 1. In the present embodiment, however, for example a small ceramic chip capacitor having a capacitance of generally 0.1 $\mu$F is used as the capacitor $C_1$ in the first integrating circuit 5. As the time constant of the first integrating circuit 5 must be the same length of the time constant in the prior art, the resistance of the resistor $R_2$ is made large instead of decreasing the capacitance of the capacitor $C_1$. Therefore, the impedance of the first integrating circuit 5 is increased, but the constant current $I_1$ obtained through the first constant current unit 3 is decreased as much as the increment of the impedance.

The output terminal of the second emitter follower 2 is connected to the plus input terminal of the comparator 6 through a resistor $R_3$. Since the input of the comparator 6 has a high but limited impedance, therefore, the resistor $R_3$ is provided in order to be balanced with the first integrating circuit 15.

The comparator 6 compares the signals applied to the plus and minus input terminals and generates a two-value signal which becomes a high level signal when the quantity of the signals at the plus input terminal exceeds the quantity of the input signal at the minus terminal. The output terminal of the comparator 6 is connected to a second integrating circuit 7. The second integrating circuit 7 comprises a capacitor $C_2$ and integrates the output signals of the comparator 6. The second integrating circuit 7 outputs the output signal of the waveform converting device, in other words, the output signal voltage $V_{out}$ is generated from the output terminal of the second integrating circuit 7.

The operation of the waveform converting device as described above is explained as follows.

An input signal voltage $V_{in}$ is applied to the base of each of the npn transistors $Q_1$ and $Q_2$ which are arranged to constitute the first and second emitter follower circuits 1 and 2 respectively, so that the impedance of the input signal is converted through the circuits 1 and 2. The constant current $I_1$ obtained through the first constant current unit 3 is adjusted to be smaller than the constant current $I_2$ obtained through the second constant current unit 4. Therefore, there occurs a difference between the base-emitter voltage of the npn transistor $Q_1$ and the base-emitter voltage of the npn transistor $Q_2$. That is, assuming that the base-emitter reverse saturation currents of the npn transistors $Q_1$ and $Q_2$ are represented as $I_{EO1}$ and $I_{EO2}$ respectively and that a thermal voltage is represented as $V_T$, the respective base-emitter voltages $V_{BE1}$ and $V_{BE2}$ of the transistors $Q_1$ and $Q_2$ are represented as follows.

$$V_{BE1} = V_T \ln (I_1/I_{EO1}) \ldots \quad (1)$$

$$V_{BE2} = V_T \ln (I_2/I_{EO2}) \ldots \quad (2)$$

wherein the thermal voltage $V_T$ is represented as follows; assuming that the electron charge is q, Boltzmann's constant is k and that absolute temperature is T.

$$V_T = k \cdot T/q$$

Since the npn transistors $Q_1$ and $Q_2$ are incorporated in an integrated circuit, the equation $I_{EO1} = I_{EO2}$ can be easily obtained. Therefore, an equation (3) is obtained by subtracting the equation (1) from the equation (2) as follows.

$$V_{BE2} - V_{BE1} = V_T \ln (I_2/I_1) \quad (3)$$

That is to say, if the constant current $I_1$ is different from the constant current $I_2$, there occurs a difference between the base-emitter voltages $V_{BE1}$ and $V_{BE2}$ on the basis of the ratio $I_2/I_1$. The difference between the base-emitter voltages $V_{BE1}$ and $V_{BE2}$ can be used as the level shifted voltage of the second emitter follower circuit 2 to the first emitter follower circuit 1. Therefore, according to the equation (3), the predetermined level shifted voltage of the second emitter follower circuit 2 can be obtained by adjusting the constant current $I_1$ properly smaller than the constant current $I_2$. By this way, it becomes possible to omit a resistor $R_{11}$ which must be provided for the level shift of the voltage in the conventional second emitter follower circuit 12.

Figure 2:
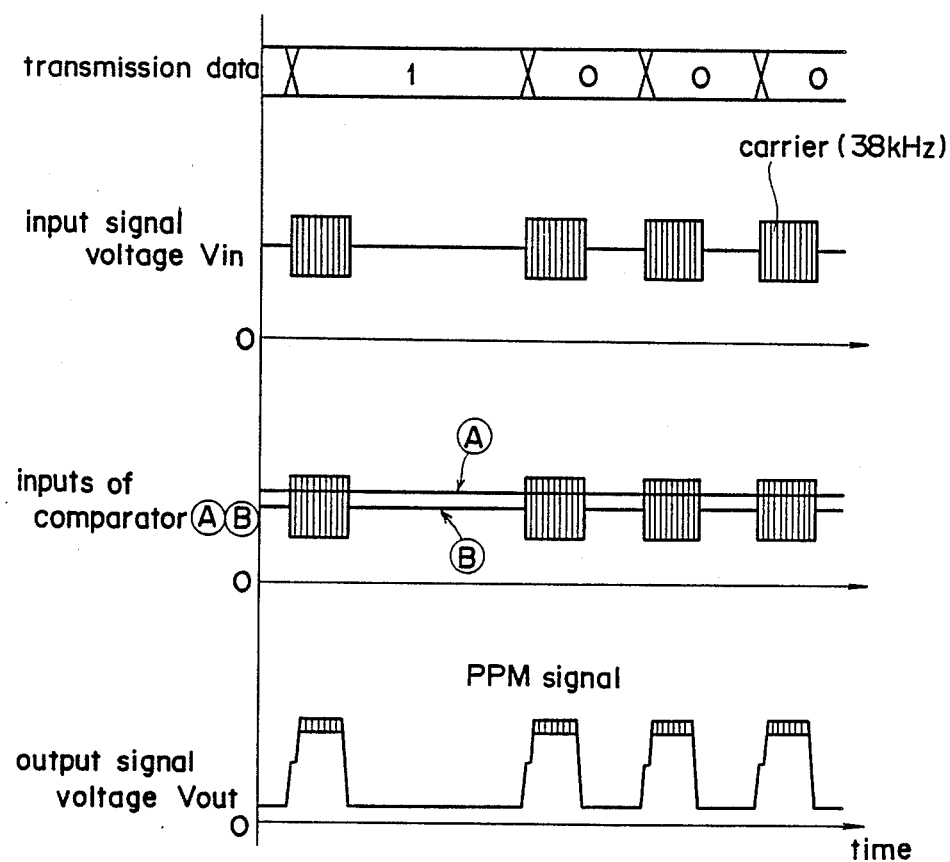
FIG. 2 is a wave form chart showing an operation of the waveform converting device shown in FIG. 1.

The output signal of the first emitter follower circuit 1 is transmitted to the minus input terminal of the comparator 6 through the first integrating circuit 5. In the first integrating circuit 5, since the time constant is set as long as in the prior art though the capacitance of the capacitor $C_1$ is reduced, a constant signal voltage generally in the input level can be outputted. As described above, the level of the input signal voltage $V_{in}$ is shifted through the second emitter follower circuit 2 and is transmitted to the plus input terminal of the comparator 6 through the resistor $R_3$. Therefore, both of the input signals applied at the plus and minus terminals of the comparator 6 are the same signals as those shown in FIG. 2. Therefore, in a similar way to that in the prior art hereinafter, the output signal of the comparator 6 is transmitted to the second integrating circuit 7 and is generated as the output signal voltage $V_{out}$ of the waveform converting device. The output signal voltage $V_{out}$ becomes the original PPM signal, so that the carrier signal can be removed.

According to the constitution as described above, the capacitor $C_1$ in the first integrating circuit 5 can be made by a small ceramic chip capacitor with small capacitance which is inexpensive and easy to incorporate into an integrated circuit. Moreover, since it becomes possible to omit a resistor $R_{11}$ which has been provided in the conventional waveform converting device for the level shift of the voltage, the problem of preventing the fabrication of the waveform converting device in an integrated circuit form can be solved, thereby reducing the cost for producing the waveform converting device.

What is claimed is:

1. A waveform converting device comprising:
   first and second emitter follower circuits for independently converting the impedance of an input signal;
   said first emitter follower circuit including a first transistor;
   said second emitter follower circuit including a second transistor;
   first constant current supply means operatively connected to an emitter of said first transistor provided in said first emitter follower circuit, for supplying a first constant current means of a first value,
   second constant current supply means operatively connected to an emitter of said second transistor provided in said second emitter follower circuit, for supplying a second constant current which is greater than said first value, the ratio between said first and second constant currents being a set constant,
   a first integrating circuit for integrating an output voltage of said first emitter follower circuit,
   a comparator for comparing the output voltage of said first integrating circuit with an output voltage of said second emitter follower circuit, and
   a second integrating circuit for integrating an output voltage of said comparator.

2. The waveform converting device according to claim 1, wherein said first and second transistors are npn type transistors.

3. The waveform converting device according to claim 1, wherein said first integrating circuit is composed of a resistor and a small ceramic chip capacitor of small capacitance.

4. The waveform converting device according to claim 1, wherein said comparator generates a two-value signal of high level when the input voltage at the plus terminal transmitted from the second emitter follower circuit exceeds the input voltage at the minus terminal transmitted from the first emitter follower circuit.

5. The waveform converting device according to claim 1, wherein said second integrating circuit arrangement includes a capacitor.

6. The waveform converting device according to claim 1, wherein said first and second supply means includes current mirror circuits of transistors and a resistor, wherein the first and second constant currents respectively flow through the transistors of said current mirror circuits.

7. The waveform converting device according to claim 1, wherein the difference between the base-emitter voltages of said first and second transistors is represented as follows:

$$V_{BE2} - V_{BE1} = V_T \ln (I_2/I_1)$$

wherein:
$V_T$ represents a thermal voltage,
$V_{BE1}$ represents the base-emitter voltage of the first transistor,
$V_{BE2}$ represents the base-emitter voltage of the second transistor, and
$I_1$ represents the first constant current and $I_2$ represents the second constant current.

8. The waveform converting device according to claim 1, wherein said second emitter circuit does not include a separate resistor.

* * * * *